United States Patent [19]

Trap

[11] 4,156,250

[45] May 22, 1979

[54] GLASS FOR THE PASSIVATION OF SEMICONDUCTOR DEVICES

[75] Inventor: Hendrikus J. L. Trap, Eindhoven, Netherlands

[73] Assignee: U.S. Philips Corporation, New York, N.Y.

[21] Appl. No.: 793,881

[22] Filed: May 4, 1977

[30] Foreign Application Priority Data

May 10, 1976 [NL] Netherlands .......................... 7604951

[51] Int. Cl.² .......................... H01L 23/30; C03C 3/10
[52] U.S. Cl. .......................................... 357/73; 65/134; 106/53; 357/38; 357/52; 357/55; 357/20
[58] Field of Search ............... 357/52, 54, 73; 106/53; 65/134

[56] References Cited

U.S. PATENT DOCUMENTS

| | | | |
|---|---|---|---|
| 3,241,010 | 3/1966 | Eddleston | 357/73 |
| 3,542,572 | 11/1970 | Dalton et al. | 357/73 |
| 3,801,878 | 4/1974 | Merrin | 357/73 |
| 4,073,654 | 2/1978 | Wu | 106/53 |

*Primary Examiner*—William D. Larkins
*Attorney, Agent, or Firm*—Thomas A. Briody; Edward J. Connors, Jr.; James J. Cannon, Jr.

[57] ABSTRACT

A passivating glass for semiconductor devices. The glass contains $GeO_2$, PbO, $SiO_2$ and $Al_2O_3$ and, in addition, a small defined quantity of water.

6 Claims, 1 Drawing Figure

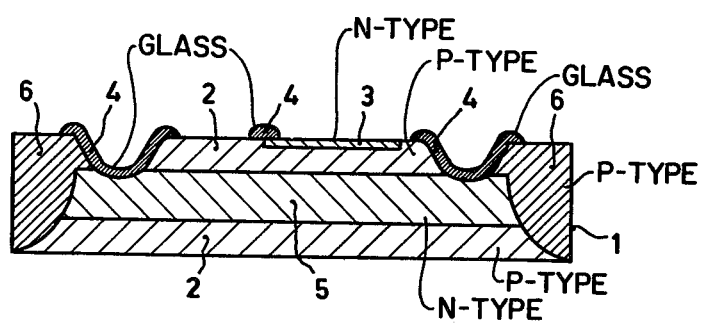

GLASS FOR THE PASSIVATION OF SEMICONDUCTOR DEVICES

The invention relates to glass which is suitable for passivating semiconductor devices and to devices in which such a passivating glass coating is used.

Such a coating is intended for protecting the semiconductor, the p-n junctions in such a device in particular, from atmospheric influences such as water, watervapour and from those of migrating ions. These migrating ions may emanate as contaminants from the ambient medium or from the casing, which consists, for example, of synthetic resin material.

U.S. Pat. Nos. 3,801,878 and 3,801,879 disclose a category of alkali-free alumino(boro) silicate glasses which are particularly suitable for this use. The suitability of glasses for this appliance is determined by the electrical properties and by compatibility of the physical properties such as coefficient of expansion, softening temperature etc. With those of the relevant semiconductor system.

Conventional glasses having compatible thermal properties, alkali-free boro-alumino-silicate glasses in particular, are, as regards their electrical properties, less satisfactory, inter alia because of the fact that they exhibit polarisation phenomena. This is obviated by rendering the glass which is by nature ion-conductive, somewhat electron-conductive by introducing plurivalent ions, preferably in the highest valency. In the above-mentioned U.S. Patent Specifications this is achieved by chosing glass having a high lead content, which is melted in an oxidizing atmosphere.

It appeared, however, that, in the surface layer of these glasses there is an unsufficient concentration of reactive lead ions, notably there where their presence is the most desired. The result therefor is that the passivating action of the glass on a semiconductor device is insufficient so that the life of such a device is short in practice. In addition, the breakdown voltage of such a layer is comparatively low.

In experiments which led to the invention it appeared that the presence of germanates in the glass has a particularly favourable influence. Germanate glasses have a more open structure than the corresponding germanate-free silicate glasses so that the lead ions present in the $GeO_2$-containing glasses have a sufficient freedom of movement to migrate to the surface layer.

The glass according to the invention is characterized in that its composition in mol.% is in the following ranges:

| | | |
|---|---|---|
| $SiO_2$ | 50–70 | |
| $Al_2O_3$ | 3,5–20 | $\dfrac{PbO}{Al_2O_3} \geq 1$. preferably approximately 2. |
| PbO | 7,5–40 | |
| $GeO_2$ | 3–20 | | the glass containing water, expressed in $cm^3$ water vapour, reduced to 0° C. and 76 cm Hg, per $cm^3$ of glass between $10 \times 10^{-4}$ and $100 \times 10^{-4}$.

Essential for a proper operation of the glass is the presence of a very small quantity of water therein. When preparing the glass measures must be taken such that water can enter it, for example by chosing hydrous raw materials such as hydrated aluminium oxide $HAlO_2$ instead of $Al_2O_3$.

An excess of water in the mixture is not harmful: it evaporates on melting.

For the passivating action of a glass an open structure is apparently of importance. This is promoted by the presence of germanium oxide in the glass and also the included water plays a role.

In addition, for obtaining an "open" structure it is favorable when the glass, after melting and homogenizing, is quenched from a temperature just above the transformation range to room temperature, for example in cold water.

The dielectric constant of the glass according to the invention varies from approximately 7.2 to 11.7 and the vitrification temperature, i.e. the temperature at which the viscosity of the glass is $10^{6.5}$ poises, between approximately 825° and 975° C.

The glass according to the invention differs from the prior art glass in that it has a much higher breakdown voltage and it gives the semiconductor device passivated herewith a much longer life.

The best method of applying the vitreous layer to the semiconductor devices to be protected is the method in accordance with British Patent Application No. 76/1175 U.S. Pat. application Ser. No. 644,070, according to which the layer is applied by means of electrophoresis of a dispersion of glass particles in a liquid dispersion medium which dispersion has a specific conductivity of not more than $10^{-10}$ $Ohm^{-1}$ $cm^{-1}$ and, preferably, contains an auxiliary dispersion agent in the form of an ionisable material, comprising a multivalent metal ion and at least one ion having at least one apolar organic group.

Other methods of applying the glass are by means of cathodic sputtering or by means of a suspension which is applied by means of a brush or a doctor's blade and, furthermore, by means of sedimentation, preferably by centrifuging.

By way of non-limitative example some glass compositions and a description of the method of applying the coating on an integrated circuit on a semiconductor crystal are given herebelow, also with reference to the accompanying drawing, which shows a semconductor device having a passivating glass coating according to the present invention.

Quartz sand, lead silicate (85.4 wt.% PbO and 14.6 wt.% $SiO_2$), alumina (66.8 wt.% $Al_2O_3$ and 33.2 wt.% $H_2O$), zinc white (ZnO), germanium oxide ($GeO_2$) and magnesium oxide (93 wt.% MgO, 4% $SiO_2$ and 3% CaO) were chosen as starting materials. By means of melting the glass compositions specified in the Table were produced from these materials. The melt was quenched in cold water and thereafter ground to a particle size between 0.1 and 10 μm with an average value of 3 μm. The Table specifies the dielectric constant ($\epsilon$) at 1 MHz, breakdown voltage $V_f$ in volts in a device as described hereinafter with reference to the drawing and the vitrifying temperature $T_V$ in °C., i.e. the temperature at which the viscosity of the glass is $10^{6.5}$ poises, and Q the quantity of the charge per surface unit in $10^{11}$ $q/cm^2$ glass surface, q being the electrostatic unit of charge. The value Q relates to the dielectric double layer which appears at the interface glass Si-crystal. The sign is chosen from the glass side. Owing to the great positive charge at the crystal side obtained with the glasses according to the invention a high passivating action and a high breakdown voltage is obtained. The water content is indicated in $cm^3$ of water vapour, reduced to °C. and 76 cm Hg, per $cm^3$ of glass.

TABLE

| No. | Composition in mole % | | | | | | $H_2O$ | (1 MHz) | $V_f$ (Volts) | $T_{gl}$ (°C.) | $Q_{11}$ 10 q/cm$^2$ |
| --- | --- | --- | --- | --- | --- | --- | --- | --- | --- | --- | --- |
| | $SiO_2$ | PbO | $Al_2O_3$ | ZnO | MgO | $GeO_2$ | | | | | |
| 1 | 66.8 | 11.5 | 11.5 | 0.1 | 0.1 | 10 | $12 \times 10^{-4}$ | 7.22 | 1100 | 950 | −36.2 |
| 2 | 52.8 | 21.5 | 15.5 | 0.1 | 0.1 | 10 | $15 \times 10^{-4}$ | 10.97 | 300 | 843 | −15.2 |
| 3 | 56.8 | 19.5 | 13.5 | 0.1 | 0.1 | 10 | $13,5 \times 10^{-4}$ | 9.87 | 400 | 867 | −16.1 |
| 4 | 56.8 | 21.5 | 11.5 | 0.1 | 0.1 | 10 | $17 \times 10^{-4}$ | 9.81 | | 904 | −22.5 |
| 5 | 56.8 | 13.5 | 11.5 | 0.1 | 0.1 | 18 | $15 \times 10^{-4}$ | 8.79 | 1000 | 872 | −37.4 |
| 6 | 56.8 | 21.5 | 17.5 | 0.1 | 0.1 | 4 | $13 \times 10^{-4}$ | 10.87 | 550 | 896 | −24.5 |

In a separate experiment dry oxygen was passed through the melts of glass No. 4. This caused the water content to decrease to $7 \times 10^{-4}$. This modified glass did not have satisfactory passivating properties.

The particles are dispersed in a dispersion agent consisting of isoparaffins, together with an auxiliary dispersion agent. The latter contained, for example, 1 part by weight of a Ca-soap of didecylester of sulfosuccinic acid, 1 part by weight of a Cr-soap of a mixture of alkylsalicylates, the alkyl group of which comprises 8–14 C-atoms and 1 part by weight of a copolymer of lauryl stearyl methacrylate and 2-methyl-5-vinylpyridine.

0.75 g of this mixture is dissolved in 1 l of isoparaffin. 20 ml of this solution is added together with 10 g of glass powder of one of the above-mentioned compositions (particle size approximately 3 μm) and 10 ml of a solution of 20 g/l lauryl stearyl polymethacrylate solution in an isoparaffin solution to 1 l of isoparaffin mixture.

The specific conductivity of this solution is approximately $5 \times 10 - 12 \Omega - 1 cm^{-1}$.

A semiconductor slice is suspended at a distance of 11 mm from a Pt counter electrode in the dispersion and a voltage of 200 volts is applied.

After approximately 1 minute an 11 μm thick glass coating has been obtained.

A semiconductor device this obtained has a particularly long life when it is exposed to atmospheric influences.

The accompanying drawing is a sketch of a semiconductor device having a passivating glass coating according to the invention, which consists of a 230 μm thick slice (1) of n-type silicon, which is made p-conductive (2) to a depth of 40 μm by means of diffusion of boron. The areas (6) are applied in advance by a locally very deep p-type diffusion. Thereafter an n-conductive zone (3) is applied to a depth of 15 μm by means of diffusion of phosphor. The core (5) then formed consists of the original n-conductive silicon. The glass layers (4) serve as a protection of the p-n junctions located thereunder.

What is claimed is:

1. Glass, containing $SiO_2$, PbO and $Al_2O_3$, suitable for use for the passivation of semiconductor devices, consisting essentially of the composition, in mol.% in the range of:

| | |
| --- | --- |
| $SiO_2$ | 50–75 |
| $Al_2O_3$ | 3.5–20 |
| PbO | 7.5–40 |
| $GeO_2$ | 3–20 | the amount of PbO being greater than the amount of $Al_2O_3$, the glass containing water, expressed in cm$^3$ of water vapour, reduced to 0° C. and 76 cm Hg per cm$^3$ of glass between $10 \times 10^{-4}$ and $100 \times 10^{-4}$.

2. Glass as claimed in claim 1, consisting essentially of the composition, in mol.% in the range:

| | |
| --- | --- |
| $SiO_2$ | 50–75 |
| $Al_2O_3$ | 10–20 |
| PbO | 10–25 |
| $GeO_2$ | 3–20 | the glass containing water, expressed in cm$^3$ in water vapour, reduced to 0° C. and 76 cm Hg per cm$^3$ of glass between $10 \times 10^{-4}$ and $100 \times 10^{-4}$.

3. Glass as claimed in claim 1, wherein the amount of PbO is substantially twice the amount of $Al_2O_3$.

4. A semiconductor device provided with a coating of passivating glass as claimed in claim 1.

5. Glass as claimed in claim 1, wherein said composition is derived at least in part from a starting mixture comprising hydrous raw materials including hydrated alumina.

6. Glass as claimed in claim 1, wherein said glass is melted and homogenized and subsequently quenched at a temperature below room temperature.

* * * * *